United States Patent
Chiang et al.

(10) Patent No.: US 11,854,594 B2
(45) Date of Patent: Dec. 26, 2023

(54) DATA PROCESSING METHOD, DATA PROCESSING CIRCUIT, AND COMPUTING APPARATUS

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Tzu-Chiang Chen, Hsinchu (TW); Meng-Fan Chang, Taichung (TW)

(73) Assignee: Taiwan Semiconductor Manufacturing Company, Ltpd., Hsinchu (TW)

( * ) Notice: Subject to any disclaimer, the term of this patent is extended or adjusted under 35 U.S.C. 154(b) by 0 days.

(21) Appl. No.: 17/697,951

(22) Filed: Mar. 18, 2022

(65) Prior Publication Data
US 2023/0298651 A1 Sep. 21, 2023

(51) Int. Cl.
*G11C 11/22* (2006.01)
*G06N 3/063* (2023.01)
*G11C 11/54* (2006.01)

(52) U.S. Cl.
CPC .......... *G11C 11/2273* (2013.01); *G06N 3/063* (2013.01); *G11C 11/2275* (2013.01); *G11C 11/2277* (2013.01); *G11C 11/54* (2013.01)

(58) Field of Classification Search
CPC ...................................................... G06N 3/063
See application file for complete search history.

(56) References Cited

U.S. PATENT DOCUMENTS

| | | | |
|---|---|---|---|
| 7,692,949 B2 * | 4/2010 | Nirschl | G11C 13/0004 365/158 |
| 8,078,793 B1 * | 12/2011 | Yakovlev | G11C 16/10 711/144 |
| 2015/0016207 A1 * | 1/2015 | Louie | G11C 11/417 365/229 |
| 2022/0067517 A1 * | 3/2022 | Aslandere | B60W 30/00 |

* cited by examiner

*Primary Examiner* — Douglas King
(74) *Attorney, Agent, or Firm* — JCIPRNET

(57) ABSTRACT

A data processing method, a data processing circuit, and a computing apparatus are provided. In the method, data is obtained. A first value of a bit of the data is switched into a second value according to data distribution and an accessing property of memory. The second value of the bit is stored in the memory in response to switching the bit.

20 Claims, 8 Drawing Sheets

DATA PROCESSING METHOD, DATA PROCESSING CIRCUIT, AND COMPUTING APPARATUS

BACKGROUND

A memory may be used to store data. It should be noticed that the memory may occur soft errors or hard errors for writing or reading data. For subsequent applications such as computation, prediction, or recognition, it may result in worse performance with wrong data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
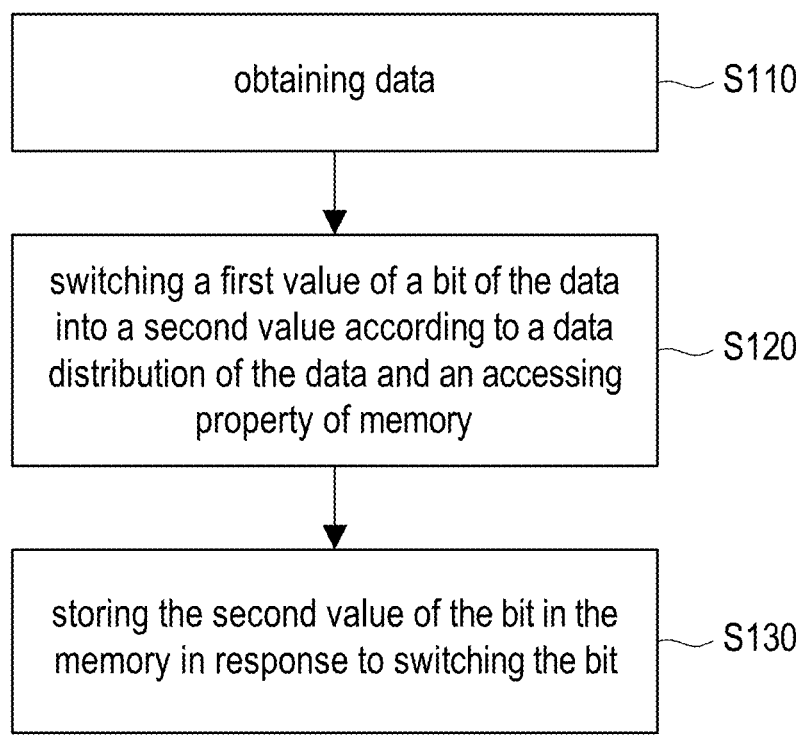
FIG. 1 is a flowchart illustrating a data processing method according to one of the exemplary embodiments of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart illustrating a data processing method according to one of the exemplary embodiments of the disclosure. Referring to FIG. 1, data is obtained (step S110). Specifically, the data could be obtained from inter or external storage, I/O interface, and processor. In one embodiment, the data could be a computed result. In another embodiment, the data could be raw data without computation.

In one embodiment, a neural network is trained, and one or more weights of the neural network are used as the data. The neural network could be, for example, convolutional neural network (CNN), recurrent neural network (RNN), long short term memory (LSTM), or the likes. However, the type of the neural network is not limited thereto.

It should be noticed that the neural network is an important subject in artificial intelligence (AI), which makes decisions by simulating how human brain cells work. It is worth noting that there are many neurons in human brain cells, and these neurons are connected through synapses. Each neuron can receive a signal through the synapse and transmit the output obtained by transforming the signal to another neuron. The transformation ability of each neuron is different, and human beings have the ability of thinking and judgment through the aforementioned signal transmission and transformation. In the operation of each neuron, an input component is multiplied by one weight of the corresponding synapse (possibly with a bias) and then output through the operation of a non-linear function (for example, an activation function) to extract features.

Figure 2A:
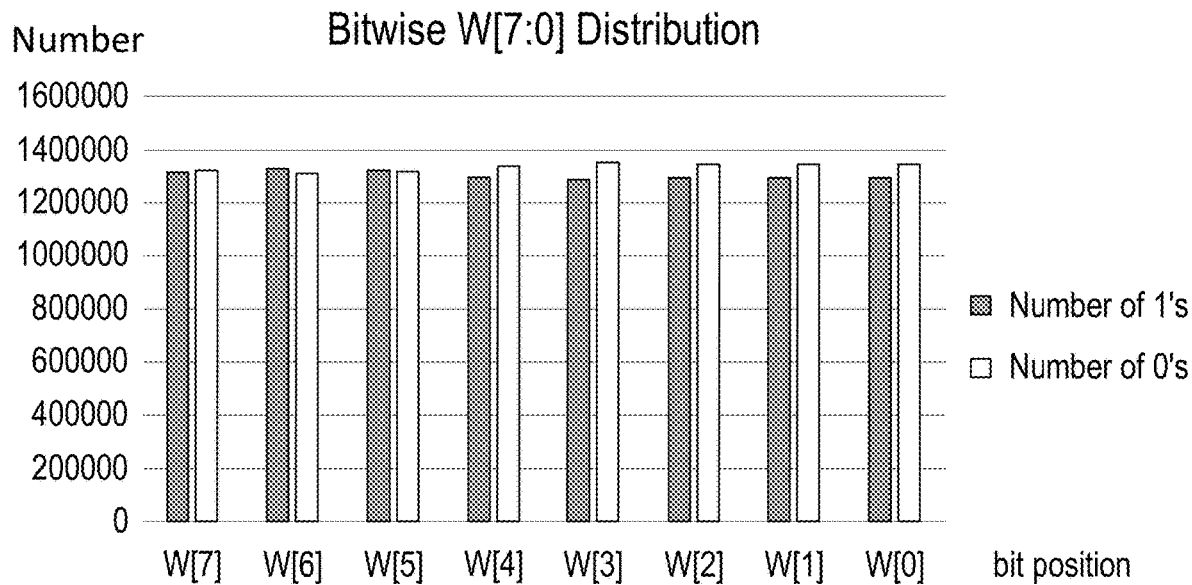
FIG. 2A is a schematic diagram illustrating a uniform distribution of a bit string according to one of the exemplary embodiments of the disclosure.
Figure 2B:
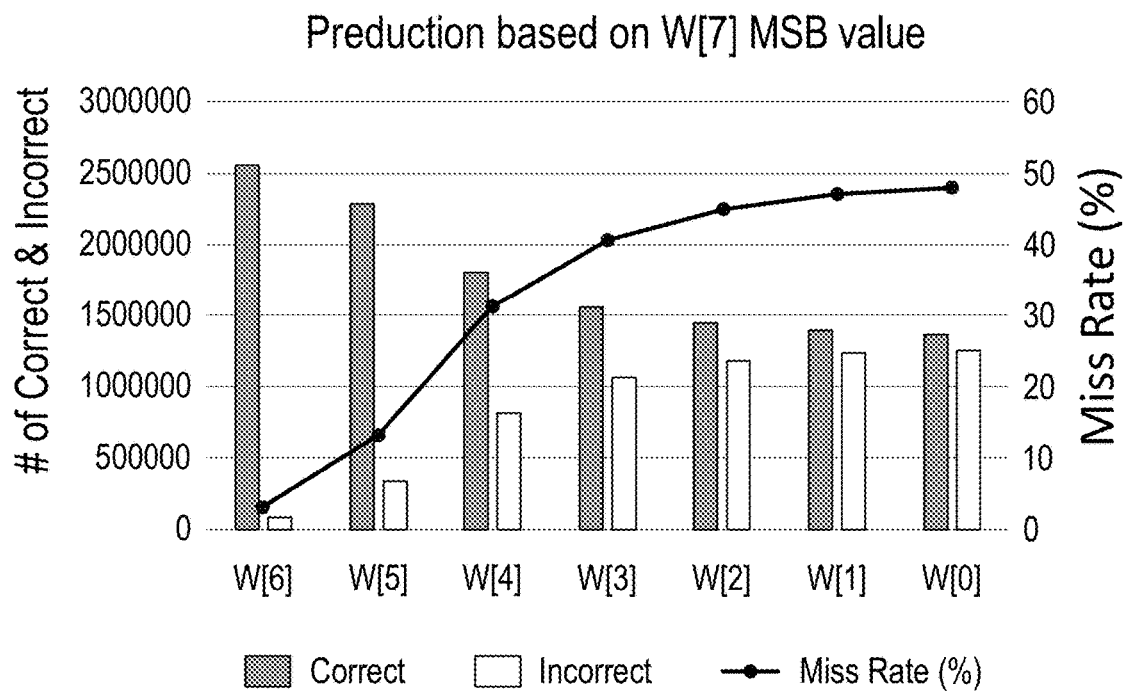
FIG. 2B is a schematic diagram illustrating miss rate according to one of the exemplary embodiments of the disclosure.

Weight is one of the important elements of a neural network. In some implementations, some weights may be wrong. The judgment result of the neural network may not be accurate with wrong weights. For example, FIG. 2A is a schematic diagram illustrating a uniform distribution of a bit string according to one of the exemplary embodiments of the disclosure. Referring to FIG. 2A, it is assumed that the bit string of weights is an 8-bit weight, and the statistical result of the 8-bit weight is a uniform distribution. It means that the value could be 0 or 1 equally. Furthermore, there is no obvious correlation if the whole 8-bit weight is analyzed separately. FIG. 2B is a schematic diagram illustrating miss rate according to one of the exemplary embodiments of the disclosure. Referring to FIG. 2B, if the prediction of a neural network is determined based on the value of the most significant bit (MSB) in the 8-bit weight of FIG. 2A, the miss rate of the prediction may close to 50% at the bit position with the lower order.

In other embodiments, the type of the data could be others based on the actual requirement.

Referring to FIG. 1, a first value of a bit of the data is switched into a second value according to data distribution and an accessing property of memory (step S120). In one embodiment, the data is a bit string, a bit array, or a bit sequence. Specifically, In one embodiment, one or more bits of the data could be the first value or the second value. For example, the first value is one of "0" and "1" (i.e., binary information), and the second value is another one of "0" and "1". For another example, the first value is one of "−1" and "1", and the second value is another one of "−1" and "1".

In one embodiment, the memory includes one or more memory cells. One memory cell is used for storing one bit of the data. In one embodiment, the memory cell of the memory has a first state and a second state. For example, the first state is one of high voltage level and low voltage level, and the second state is another one of high voltage level and low voltage level. For another example, the first state is one of on and off state, and the second state is another one of on and off state.

In one embodiment, the state of the memory cell represents a value. For example, the first state represents one of "0" and "1", and the second state is another one of "0" and "1". For another example, the first state represents one of "−1" and "1", and the second state is another one of "−1" and "1".

In one embodiment, the first value of the bit satisfies the first state with a higher probability relative to the second state is determined according to the data distribution of the data. The data distribution is the probability distribution of the values of the data. The data distribution could be used to predict the values of the data. Whether the first value of the bit is the one value that represents the first state or the second state of the memory cell. Based on the data distribution, the probability that the first value of the bit is the value that represents the first state and the probability that the first value of the bit is the value that represents the second state could be estimated.

In one embodiment, when (or only when) the probability that the first value of the bit is the value that represents the first state is higher than the probability that the first value of the bit is the value that represents the second state, it may be considered as the first value of the bit satisfies the first state with a higher probability or the first value of the bit satisfies the second state with a lower probability, and the first value of the bit is switched into the second value. In other words, when (or only when) a predicted value of the bit is the value of the second state of the memory cell with a lower probability, the value of the bit would be switched into another value. For example, the predicted value of the bit is "1", and the bit would be switched into "0".

In one embodiment, when (or only when) the probability that the first value of the bit is the value that represents the first state is not higher than the probability that the first value of the bit is the value that represents the second state, it may be considered as the first value of the bit satisfies the second state with a higher probability or the first value of the bit satisfies the first state with a lower probability, and the first value of the bit is retained as the same. In other words, when (or only when) a predicted value of the bit is the value of the second state of the memory cell with a higher probability, the value of the bit would remain the same.

In one embodiment, the data is a bit string/sequence/array and the data distribution is non-uniform distribution. When (or only when) a previous bit of the bit string/sequence/array satisfies the second state with the higher probability, the first value of the bit satisfies the first state with the higher probability relative to the second state is determined according to the data distribution of the data. The previous bit is located at a bit position with a higher order or a lower order in the bit string/sequence/array than the (current) bit. For example, the (current) bit is located in the second-bit position, and the previous is located in the third-bit position. For example, the (current) bit is located in the second-bit position, and the previous is located in the first-bit position. In other words, the value of a previous bit would be different from the value of the (current) bit. Therefore, the first value of the current bit can be predicted based on a known value of a previous bit.

Figure 3A:
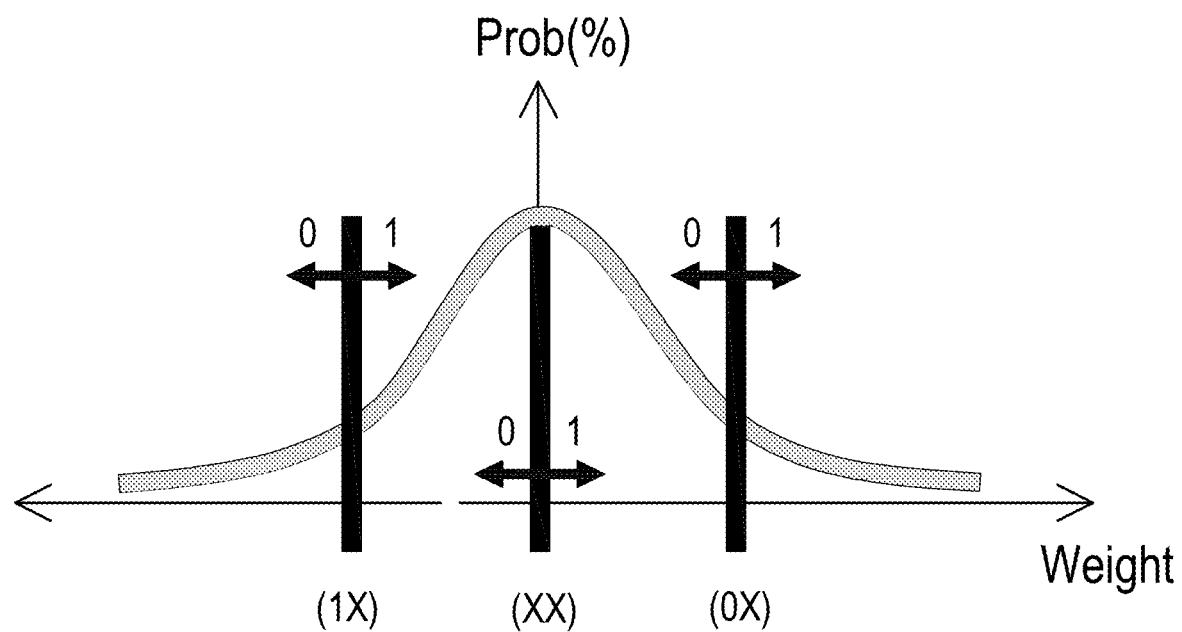
FIG. 3A is a schematic diagram illustrating a normal distribution of a bit string according to one of the exemplary embodiments of the disclosure.

For example, FIG. 3A is a schematic diagram illustrating a normal distribution of a bit string according to one of the exemplary embodiments of the disclosure. Referring to FIG. 3A, it is assumed that the data distribution of the weights of the neural network is a non-uniform distribution (normal distribution as an example in FIG. 3A). FIG. 3A illustrates a zero-centered Gaussian 2-bit weight distribution in 2's complement representation. If the value of the first bit is unknown, the probabilities that the value is "0" and "1" would be the same. However, If the value of the first bit is known, for example, "0", the probability that the value of the second bit is "1" is higher than the probability that the value of the second bit is "0". If the value which represents the second state of the memory cell is "0", the value of the second bit would be switched.

Figure 3B:
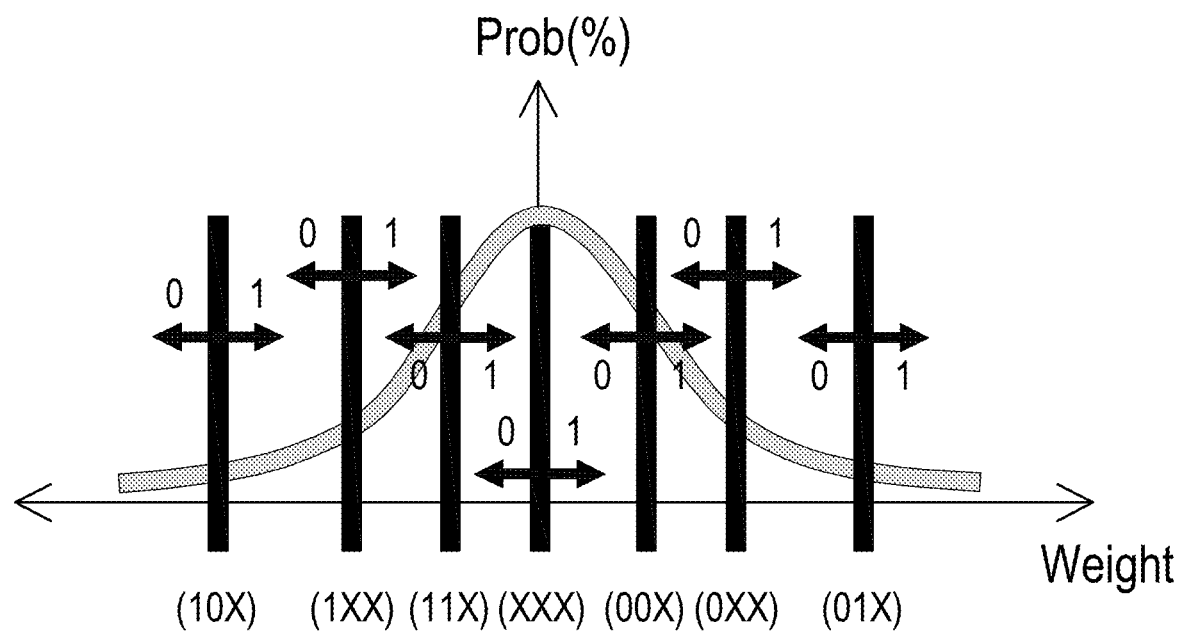
FIG. 3B is a schematic diagram illustrating a normal distribution of a bit string according to one of the exemplary embodiments of the disclosure.

Furthermore, FIG. 3B is a schematic diagram illustrating a normal distribution of a bit string according to one of the exemplary embodiments of the disclosure. Referring to FIG. 3B, it is assumed that the data distribution of the weights of the neural network is a non-uniform distribution (normal distribution as an example in FIG. 3B). FIG. 3B illustrates a zero-centered Gaussian 3-bit weight distribution in 2's complement representation. If the value of the first bit is unknown, the probabilities that the value is "0" and "1" would be the same. However, If the value of the first bit is known, for example, "0", the probability that the value of the second bit is "1" is higher than the probability that the value of the second bit is "0". If the value which represents the second state of the memory cell is "0", the value of the second bit would be switched. If the value of the second bit is known, for example, "1", the probability that the value of the third bit is "0" is higher than the probability that the value of the third bit is "0". If the value which represents the third state of the memory cell is "1", the value of the third bit would be switched.

In one embodiment, the accessing property of the memory is related to power consumption. In one embodiment, the accessing property of the memory is that reading the memory cell with a lower current at the second state relative to the first state. In other words, it may cost less current for reading at the second state than reading at the first state. When (or only when) the value is stored as the value that represents the second state of the memory cell, the power may be reduced. In another embodiment, the accessing property of the memory is that writing the memory cell with a lower current at the second state relative to the first state. In some embodiments, the accessing property of the memory is that accessing the memory cell with less error at the second state relative to the first state.

Figure 4:
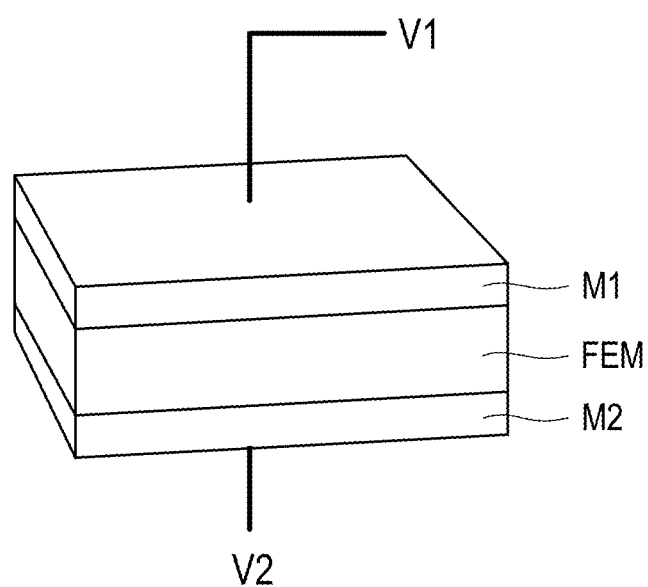
FIG. 4 is a schematic diagram illustrating a ferroelectric tunnel junction (FTJ) according to one of the exemplary embodiments of the disclosure.

In one embodiment, one or more memory cells of the memory are ferroelectric tunnel junctions (FTJs). The FTJ is a metal-interfacial layer-metal structure. For example, FIG. 4 is a schematic diagram illustrating a FTJ according to one of the exemplary embodiments of the disclosure. Referring to FIG. 4, a ferroelectric (FE) material FEM is sandwiched between two metal electrodes M1 and M2. Voltages V1 and V2 are applied on the metal electrodes M1 and M2, respectively. On the other hand, Table (1) is an example of different work functions of different metals:

TABLE (1)

|  | TiN | Cu | Ru |
| --- | --- | --- | --- |
| Work function (eV) | 4.5 | 4.6 | 4.7 |

In one embodiment, the FTJ could be an asymmetric design for the work-function metal and the interfacial layer. Therefore, the FTJ with the asymmetric design may favor the non-destructive reading and high resistance state (HRS) for reducing the operating power.

Figure 5:
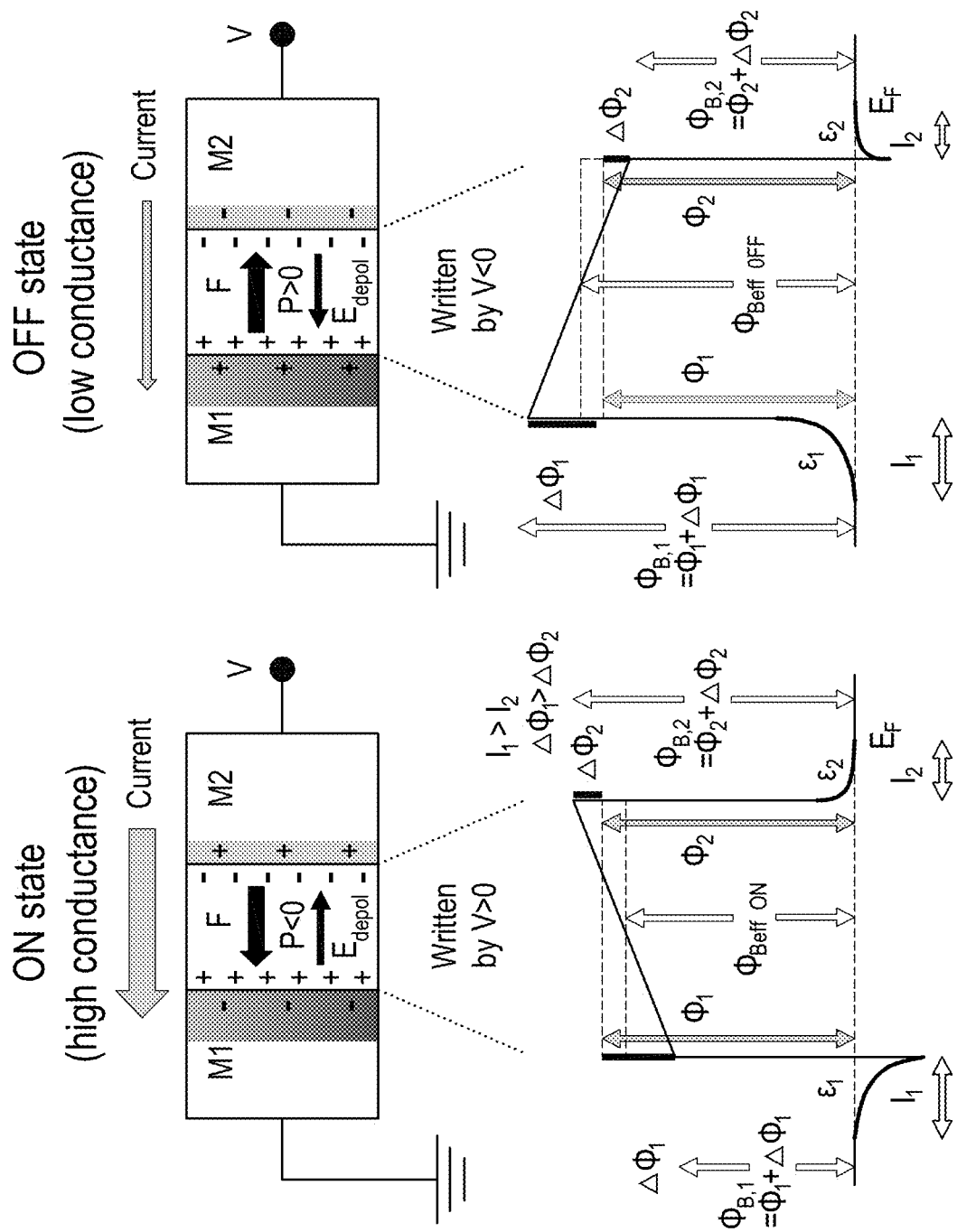
FIG. 5 is a schematic diagram illustrating potential energy profile according to one of the exemplary embodiments of the disclosure.

FIG. 5 is a schematic diagram illustrating potential energy profile according to one of the exemplary embodiments of the disclosure. Referring to FIG. 5, the potential energy profile is calculated for two opposite polarisations P in a FTJ with two metals electrodes M1 and M2. $\Phi_1$ and $\Phi_2$ denote potential steps at left and right interfaces, respectively. Potential energy profiles across the FTJ for ferroelectric polarisation F and depolarising energy $E_{depol}$ pointing left and right as shown with arrows. $\Phi_{Beff\ ON}$ and $\Phi_{Beff\ OFF}$ indicate average potential barrier heights for the two opposite polarisations P. $\triangle \Phi_1$ and $\triangle \Phi_2$ are electrostatic potential variations. $\varepsilon_1$ and $\varepsilon_2$ are the electrode dielectric permittivities. $\Phi_{B,1}$ and $\Phi_{B,2}$ are ... $I_1$ and $I_2$ are .... The dot lines denote the Fermi energy $E_F$.

Regarding the ON state (e.g., the aforementioned first state of the memory cell) with high conductance (i.e., higher current), it would be written by a voltage V higher than 0. $\Phi_{B,1}=\Phi_1-\triangle \Phi_1$. $\Phi_{B,2}=\Phi_2+\triangle \Phi_2$.

Regarding the OFF state (e.g., the aforementioned second state of the memory cell) with low conductance (i.e., lower current), it would be written by a voltage V less than 0. $\Phi_{B,1}=\Phi_1 \wedge \Phi_1$. $\Phi_{B,2}=\Phi_2-\wedge \Phi_2$.

Figure 6B:
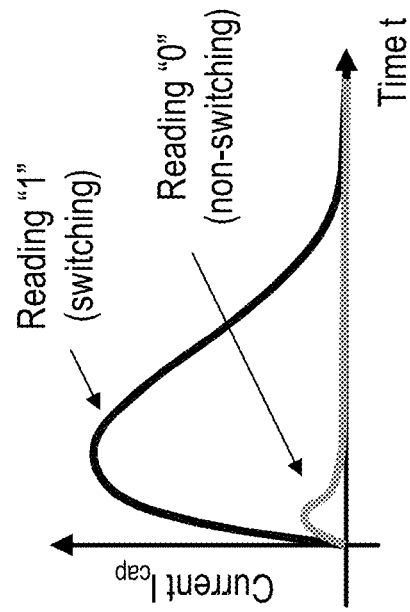
FIG. 6B is a current-time diagram according to one of the exemplary embodiments of the disclosure.
Figure 6A:
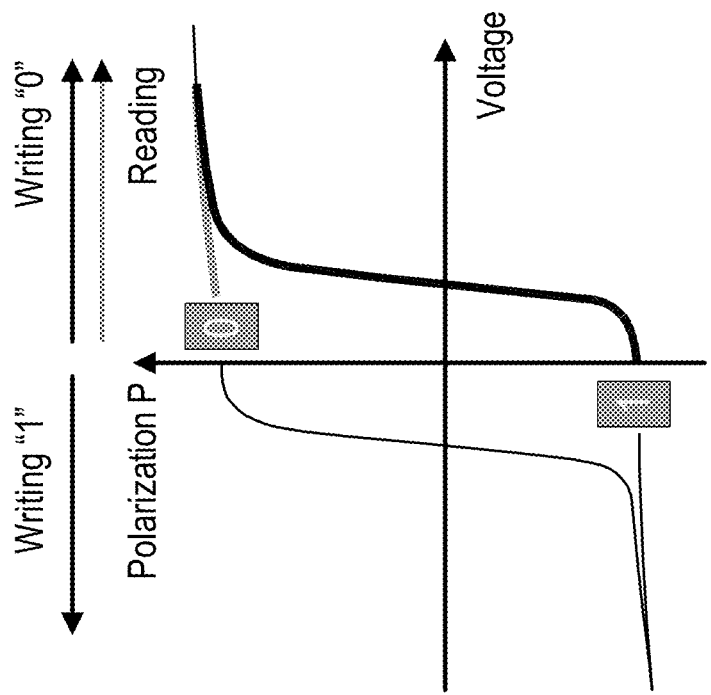
FIG. 6A is a polarization-voltage diagram according to one of the exemplary embodiments of the disclosure.

FIG. 6A is a polarization-voltage diagram according to one of the exemplary embodiments of the disclosure, and FIG. 6B is a current-time diagram according to one of the exemplary embodiments of the disclosure. Referring to FIG. 6A and FIG. 6B, it may use more current or voltage to read value "1" (e.g., the value that represents the ON state) than to read value "0" (e.g., the value that represents the OFF state). Therefore, more memory cells store a value related to low operating power, more power for overall data may be reduced.

Referring to FIG. 1, the second value of the bit is stored in the memory in response to switching the bit (step S130). Specifically, after the value of the bit is switched (if the original value satisfies the second state with a lower probability) or the value of the bit is retained (if the original value satisfies the second state with a higher probability), the value would be written in one memory cell of the memory. In one embodiment, if (or only if) more memory cells store a value related to low operating power, the overall power consumption may be improved. In another embodiment, if (or only if) more memory cells store a value related to another performance, this performance may be improved.

In one embodiment, whether the value of each bit in the data is switched is recorded for the subsequent process. For example, a mapping table is created. In the mapping table, a bit that has switched would have an indicator "1", and another bit that has not switched would have an indicator "0".

In one embodiment, the bit may be read from the memory, and the second value of the bit may be switched into the first value. Because the value of the bit is switched, the value should be switched back to the original value. However, the value of another bit without switching would not need to be switched after reading from the memory.

Figure 7:
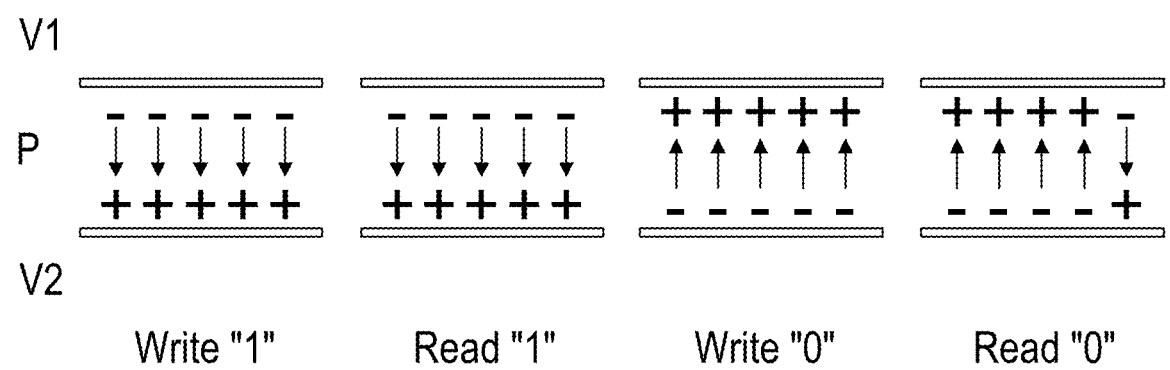
FIG. 7 is a schematic diagram illustrating write and read on a FTJ according to one of the exemplary embodiments of the disclosure.

FIG. 7 is a schematic diagram illustrating write and read on a FTJ according to one of the exemplary embodiments of the disclosure. Referring to FIG. 7, taking the FTJ of FIG. 4 as an example, and the arrows show the directions of polarisations P. Table (2) is an example of the values of the voltages V1 and V2.

TABLE (2)

|  | Write "1" | Read "1" | Write "0" | Read "0" |
| --- | --- | --- | --- | --- |
| V1 | $V_{C+}$ | $V_{read1}$ | $-V_{C+}$ | $V_{read0}$ |
| V2 | 0 | 0 | 0 | 0 |

$V_{C+}$, $V_{read1}$, and $V_{read0}$ are the values of the voltage and could be different based on different FTJs.

In one embodiment, one or more bits of the data read from the memory may be used for inference of a neural network. However, the subsequent process of the read data is not limited thereto.

Figure 8:
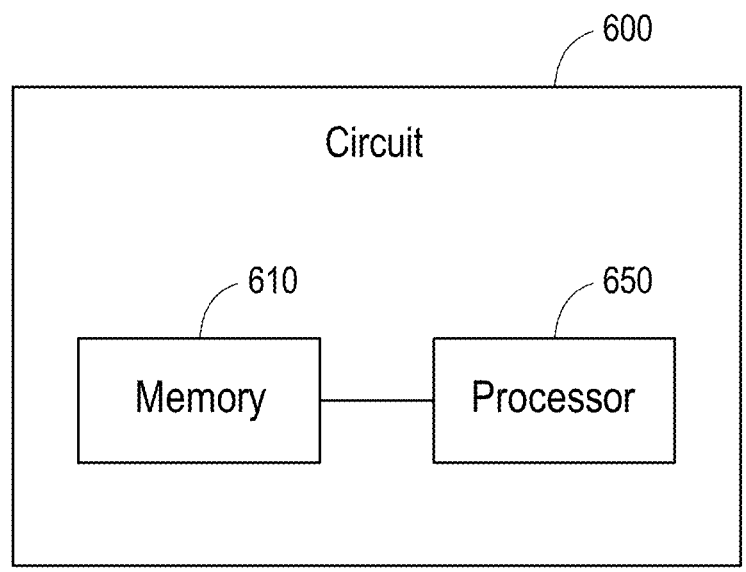
FIG. 8 is a block diagram illustrating a data processing circuit according to one of the exemplary embodiments of the disclosure.

FIG. 8 is a block diagram illustrating a data processing circuit 600 according to one of the exemplary embodiments of the disclosure. Referring to FIG. 6, the processing circuit 600 may include one or more memories 610 and one or more processors 650. A program code is stored on memory 610 and run on processor 650. The program code implements the steps of the data processing method described in one of FIG. 1 when being executed by the processor. In some embodiments, the processor 650 is configured to obtain data, switch a first value of a bit of the data into a second value according to a data distribution of the data and an accessing property of the memory, and store the second value of the bit in the memory in response to switching the bit. The data processing circuit 600 may be any type of device that includes, but is not limited to a chip, a memory module, application-specific integrated circuit (ASIC), field-programmable gate array (FPGA), or the like.

Since the program code stored in the data processing circuit 600 adopts all the technical solutions of all the foregoing embodiments when being executed by the processor 650, it at least has all the advantageous effects brought by all the technical solutions of all the foregoing embodiments, and no further description is incorporated herein.

Figure 9:
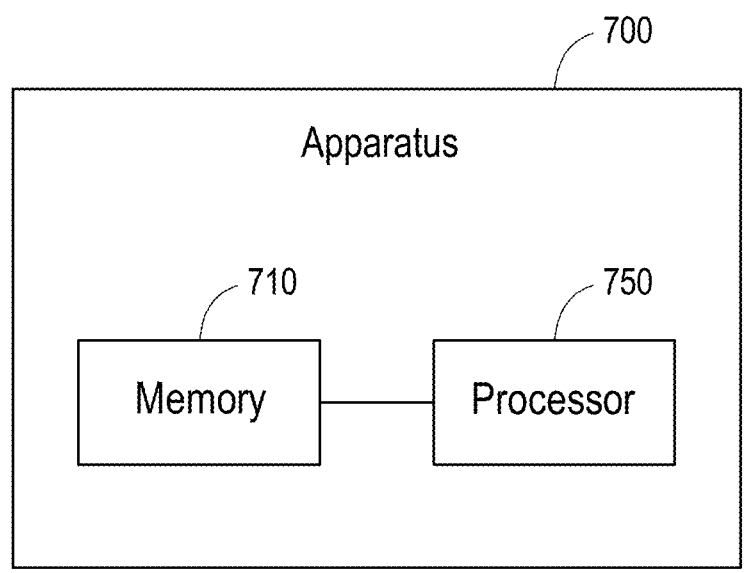
FIG. 9 is a block diagram illustrating a computing apparatus according to one of the exemplary embodiments of the disclosure.

FIG. 9 is a block diagram illustrating a computing apparatus 700 according to one of the exemplary embodiments of the disclosure. Referring to FIG. 9, the processing circuit 700 may include one or more memories 710 and one or more processors 750. A program code is stored on memory 710 and run on processor 750. The program code implements the steps of the data processing method described in one of FIG. 1 when being executed by the processor. In some embodiments, the processor 750 is configured to obtain data, switch a first value of a bit of the data into a second value according to a data distribution of the data and an accessing property of the memory, and store the second value of the bit in the memory in response to switching the bit. The computing apparatus 700 may be any type of device that includes, but are not limited to an internet of thing (IoT) equipment, a mobile station, a telephone apparatus, customer premise equipment (CPE), a wireless sensor, a handheld device, a computing device, an in-vehicle device, a wearable device, or the like.

Since the program code stored in the computing apparatus 700 adopts all the technical solutions of all the foregoing embodiments when being executed by the processor 750, it at least has all the advantageous effects brought by all the technical solutions of all the foregoing embodiments, and no further description is incorporated herein.

In accordance with some embodiments, a data processing method includes the following steps. Data is obtained. A first value of a bit of the data is switched into a second value according to data distribution and an accessing property of memory. The second value of the bit is stored in the memory in response to switching the bit.

In accordance with some embodiments, a data processing circuit includes one or more memories and one or more processors coupled to the memories. The processor is configured to obtain data, switch a first value of a bit of the data into a second value according to a data distribution of the data and an accessing property of the memory, and store the second value of the bit in the memory in response to switching the bit.

In accordance with some embodiments, a computing apparatus includes one or more memories and one or more processors coupled to the memories. The processor is configured to obtain data, switch a first value of a bit of the data into a second value according to a data distribution of the data and an accessing property of the memory, and store the second value of the bit in the memory in response to switching the bit.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A data processing method, comprising:
   obtaining data;
   switching a first value of a bit of the data into a second value according to a data distribution of the data and an accessing property of memory, wherein a memory cell of the memory has a first state and a second state, and a first probability that the first value of the bit is a value that represents the first state and a second probability that the first value of the bit is another value that represents the second state is estimated based on the data distribution;
   determining that the first value of the bit satisfies the second state with a higher probability relative to the first state according to the data distribution of the data;
   retaining the first value of the bit in response to the first value of the bit satisfying the second state with the higher probability; and
   storing the second value of the bit in the memory in response to switching the bit or retaining the bit.

2. The data processing method according to claim 1, wherein switching the first value of the bit of the data into the second value according to the data distribution of the data and the accessing property of memory comprises:
   determining that the first value of the bit satisfies the first state with a higher probability relative to the second state according to the data distribution of the data; and
   switching the first value of the bit into the second value in response to the first value of the bit satisfying the first state with the higher probability.

3. The data processing method according to claim 2, wherein the accessing property of the memory is that reading the memory cell with a lower current at the second state relative to the first state.

4. The data processing method according to claim 2, wherein the data is a bit string, and determining that the first value of the bit satisfies the first state with the higher probability relative to the second state according to the data distribution of the data comprises:
   determining that a previous bit of the bit string satisfies the second state with the higher probability, wherein the previous bit is located at a bit position with a higher order in the bit string than the bit.

5. The data processing method according to claim 1, further comprising:
   reading the bit from the memory; and
   switching the second value of the bit into the first value.

6. The data processing method according to claim 1, wherein obtaining data comprises:
   training a neural network; and
   using weights of the neural network as the data, wherein the data distribution is a non-uniform distribution.

7. The data processing method according to claim 1, wherein a memory cell of the memory is a ferroelectric tunnel junction (FTJ).

8. A data processing circuit, comprising:
   a memory; and
   at least one processor, coupled to the memory and configured for:
      obtaining data;
      switching a first value of a bit of the data into a second value according to a data distribution of the data and an accessing property of the memory, wherein a memory cell of the memory has a first state and a second state, and a first probability that the first value of the bit is a value that represents the first state and a second probability that the first value of the bit is another value that represents the second state is estimated based on the data distribution;
      determining that the first value of the bit satisfies the second state with a higher probability relative to the first state according to the data distribution of the data;
      retaining the first value of the bit in response to the first value of the bit satisfying the second state with the higher probability; and
      storing the second value of the bit in the memory in response to switching the bit or retaining the bit.

9. The data processing circuit according to claim 8, wherein the processor is further configured for:
   determining that the first value of the bit satisfies the first state with a higher probability relative to the second state according to the data distribution of the data; and
   switching the first value of the bit into the second value in response to the first value of the bit satisfying the first state with the higher probability.

10. The data processing circuit according to claim 9, wherein the accessing property of the memory is that reading the memory cell with a lower current at the second state relative to the first state.

11. The data processing circuit according to claim 9, wherein the data is a bit string, and the processor is further configured for:
   determining that a previous bit of the bit string satisfies the second state with the higher probability, wherein the previous bit is located at a bit position with a higher order in the bit string than the bit.

12. The data processing circuit according to claim 8, wherein the processor is further configured for:
   reading the bit from the memory; and
   switching the second value of the bit into the first value.

13. The data processing circuit according to claim 8, wherein the data is a bit string, and the processor is further configured for:
   training a neural network; and
   using weights of the neural network as the data, wherein the data distribution is a non-uniform distribution.

14. The data processing circuit according to claim 8, wherein a memory cell of the memory is a ferroelectric tunnel junction (FTJ).

15. A computing apparatus, comprising:
   a memory; and
   at least one processor, coupled to the memory and configured for:
      obtaining data;
      switching a first value of a bit of the data into a second value according to a data distribution of the data and an accessing property of the memory, wherein a memory cell of the memory has a first state and a second state, and a first probability that the first value of the bit is a value that represents the first state and a second probability that the first value of the bit is another value that represents the second state is estimated based on the data distribution;
      determining that the first value of the bit satisfies the second state with a higher probability relative to the first state according to the data distribution of the data;
      retaining the first value of the bit in response to the first value of the bit satisfying the second state with the higher probability; and
      storing the second value of the bit in the memory in response to switching the bit or retaining the bit.

16. The computing apparatus according to claim 15, wherein the processor is further configured for:
   determining that the first value of the bit satisfies the first state with a higher probability relative to the second state according to the data distribution of the data; and
   switching the first value of the bit into the second value in response to the first value of the bit satisfying the first state with the higher probability.

17. The computing apparatus according to claim 16, wherein the accessing property of the memory is that reading the memory cell with a lower current at the second state relative to the first state.

18. The computing apparatus according to claim 15, wherein the processor is further configured for:
   reading the bit from the memory; and
   switching the second value of the bit into the first value.

19. The computing apparatus according to claim 16, wherein the data is a bit string, and the processor is further configured for:
   determining that a previous bit of the bit string satisfies the second state with the higher probability, wherein the previous bit is located at a bit position with a higher order in the bit string than the bit.

20. The computing apparatus according to claim 15, wherein the data is a bit string, and the processor is further configured for:
   training a neural network; and
   using weights of the neural network as the data, wherein the data distribution is a non-uniform distribution.

* * * * *